(12) United States Patent
Thorson et al.

(10) Patent No.: US 7,391,937 B2
(45) Date of Patent: Jun. 24, 2008

(54) COMPACT TRANSITION IN LAYERED OPTICAL FIBER

(75) Inventors: Kevin J. Thorson, Eagan, MN (US); Rick C. Stevens, Apple Valley, MN (US)

(73) Assignee: Lockheed Martin Corporation, Bethesda, MD (US)

(*) Notice: Subject to any disclaimer, the term of this patent is extended or adjusted under 35 U.S.C. 154(b) by 0 days.

(21) Appl. No.: 11/117,918

(22) Filed: Apr. 29, 2005

(65) Prior Publication Data

US 2006/0088241 A1    Apr. 27, 2006

Related U.S. Application Data

(60) Provisional application No. 60/621,529, filed on Oct. 22, 2004.

(51) Int. Cl.
G02B 6/12    (2006.01)

(52) U.S. Cl. ............................................ 385/14; 385/31
(58) Field of Classification Search .................. 385/14, 385/31
See application file for complete search history.

(56) References Cited

U.S. PATENT DOCUMENTS

| | | | |
|---|---|---|---|
| 4,621,895 A | | 11/1986 | Motsko |
| 4,641,524 A | * | 2/1987 | Tarvin ...................... 73/335.01 |
| 5,446,814 A | | 8/1995 | Kuo et al. |
| 5,754,260 A | * | 5/1998 | Ooi et al. ....................... 349/10 |
| 6,088,163 A | * | 7/2000 | Gilbert et al. ................ 359/585 |
| 6,236,786 B1 | | 5/2001 | Aoki et al. |
| 6,243,509 B1 | | 6/2001 | Chen |
| 6,259,841 B1 | | 7/2001 | Bhagavatula |
| 6,324,328 B1 | | 11/2001 | Mehlhorn et al. |
| 6,370,292 B1 | | 4/2002 | Strake |
| 6,529,650 B1 | | 3/2003 | Tsuru |
| 6,539,157 B2 | | 3/2003 | Doi |
| 6,731,882 B1 | * | 5/2004 | Althaus et al. ............... 398/139 |
| 6,739,761 B2 | | 5/2004 | Tsukamoto et al. |
| 6,792,179 B2 | * | 9/2004 | Lu et al. ........................ 385/33 |
| 6,810,160 B2 | | 10/2004 | Sugama et al. |
| 7,019,447 B2 | * | 3/2006 | Iwasaki ....................... 313/113 |
| 7,043,111 B2 | * | 5/2006 | Ikarashi et al. ................. 385/16 |
| 2002/0067886 A1 | * | 6/2002 | Schaub ......................... 385/33 |
| 2002/0097962 A1 | | 7/2002 | Yoshimura et al. |
| 2003/0161573 A1 | * | 8/2003 | Ishida et al. ................... 385/14 |
| 2003/0223692 A1 | * | 12/2003 | Ikarashi et al. ................. 385/38 |
| 2004/0017977 A1 | * | 1/2004 | Lam et al. ...................... 385/49 |
| 2004/0105648 A1 | | 6/2004 | Brooks et al. |

(Continued)

Primary Examiner—Ellen Kim
(74) Attorney, Agent, or Firm—Oppenheimer Wolff & Donnelly LLP

(57) ABSTRACT

The present disclosure is directed to an optical device including a circuit board, an optical network and a lens kit. The circuit board has a mounting surface, and the optical fiber network is coupled to the circuit board opposite the mounting surface. The optical network includes two or more optical waveguides arranged in layers. A via extends through the mounting surface and into the optical network. The lens kit includes at least two lens pucks. At least one lens puck has a reflective element. The lens pucks are arranged to correspond with at least some of the optical waveguides. The lens kit is adapted to be inserted within the via and to reflect light traveling along an axis of the via into the optical network. The present disclosure is also directed to the lens kit and methods of making the lens kit and the optical device.

19 Claims, 4 Drawing Sheets

U.S. PATENT DOCUMENTS

| | | |
|---|---|---|
| 2004/0156576 A1 | 8/2004 | Windover |
| 2004/0184706 A1 | 9/2004 | Koreeda et al. |
| 2004/0184717 A1* | 9/2004 | Koontz et al. ............ 385/18 |
| 2005/0036118 A1* | 2/2005 | Ishikura et al. ........... 353/81 |
| 2005/0041906 A1* | 2/2005 | Sugama et al. ............ 385/14 |
| 2005/0100264 A1* | 5/2005 | Kim et al. ................. 385/14 |
| 2005/0263777 A1* | 12/2005 | Yano et al. ................ 257/79 |
| 2005/0281507 A1* | 12/2005 | Kropp ....................... 385/31 |
| 2007/0062221 A1* | 3/2007 | Ishida et al. .............. 65/386 |

* cited by examiner

COMPACT TRANSITION IN LAYERED OPTICAL FIBER

CROSS REFERENCE TO RELATED APPLICATIONS

This patent application claims priority to now abandoned U.S. provisional application for patent filed on Oct. 22, 2004, having Ser. No. 60/621,529, and titled "Compact Orthogonal Transition in Layered Optical Fiber and Method."

BACKGROUND

The present disclosure relates to layered optical networks such as optical fiber networks coupled to printed circuit boards, and the like. More specifically, the present disclosure relates to optical transitions in the layered optical networks.

Optical systems generally refer to the medium and technology associated with the transmission of signals in the form of light pulses, or photons, along a glass or plastic waveguide or fiber. Optical systems are distinguishable from electrical systems using conventional electrically conductive wires, such as copper wire, in the transmission of electrical signals. Optical systems also include advantageous capabilities over electrical systems. For example, electrical signals interact with each other and their environment. This results in a need for non-intersecting and spaced-apart electrical wire links between electronic devices or electrical components. In contrast, photons generally do not interact with each other, and this leads to the possibility of different photonic signals sharing the same optical waveguide. Accordingly, optical systems are adapted to carry much more information than electrical wire. In addition, the transmission of photonic signals over relatively short distances, of about one half of one kilometer or less, permit the use of relatively inexpensive optical components for the transmission of relatively high data rates. Comparable transmissions in electrical circuits suffer from radiofrequency losses making optical systems a preferred alternative for high data rate transmission over short distances.

Information processing systems using microprocessors, memory and associated electronics are one example of a system that provides high data rate transmissions over short distances. Generally, such systems include electronic modules that process electrical signals, but the modules include optoelectronic devices that can convert electrical signals into optical signals, and vice versa, and transmit optical signals between the modules. One example is a high-speed multiprocessor system that requires high-speed communication between the individual processors or memory. Optical signal paths between the processors or the memory can be ideal in such a system. Such systems can be implemented with optical signal paths between modules on a printed circuit board or between different circuit boards.

Printed circuit boards can include complex multilayer systems that are used as carriers for fitting surface mounted circuit components. Epoxy-resin glass cloth is often used as substrate material for printed circuit boards, although combinations of other materials such as PTFE or PMMA are also used. Optical waveguides can be attached to the substrate and can be manufactured from optical films embossed to form a desired waveguide arrangement or formed with a photolithographic process. The optical waveguides can be formed in multiple layers to create a large number of signal paths that are required to facilitate a large number of signals passed between circuit components.

As circuit components become more complicated and process more signals at higher speeds in smaller packages sizes, there is a need for a reliable circuit board structure that can facilitate the signals passing between circuit components. Circuit boards with just electrical connections suffer from the disadvantages of speed limitations and the potential of creating short circuits in systems that require many signal paths in a very small package size. Circuit boards with optical connections show promise but suffer from the disadvantage of manufacturing complexities in forming multilayer optical waveguides with reliable optical interconnects.

SUMMARY

The present disclosure is directed to an optical device that includes or can provide a large number of high-speed signal paths between circuit components coupled to the device in a relatively small space using layered optical waveguides coupled to a circuit board. Signal connections between the circuit components and the optical waveguides are provided through reliable and space saving optical interconnects that are relatively easy to manufacture in a variety of need-specific configurations and are relatively easy to implement in the optical device.

In a first aspect, the present disclosure is directed to an optical device including a circuit board, an optical network and a lens kit. The circuit board has a mounting surface, and the optical network is coupled to the circuit board opposite the mounting surface. The optical network includes two or more optical waveguides arranged in layers. The circuit board includes at least one via having an axis generally non-parallel to the mounting surface, and the via extends through the mounting surface and into the optical network. The lens kit includes at least two lens pucks, and at least one lens puck has a specularly reflective element. The lens pucks in the lens kit are arranged to correspond with at least some of the optical waveguides. The lens kit is adapted to be inserted within the via and to reflect light traveling along the axis into the optical network.

In a second aspect, the present disclosure is directed to a lens kit that is adapted for use with a two or more optical waveguides layered along an axis extending into a via. The lens kit includes two or more axially disposed lens pucks that correspond with at least some of the optical waveguides. At least one lens puck includes a transparent optical input base, at least one transparent optical output side, and a specularly reflective element for routing photonic signals from the input base to the output side. This lens puck is adapted to be inserted into the via and to reflect photonic signals traveling along the axis off-axis and into a corresponding optical waveguide.

In another aspect, the present disclosure is directed to an optical device including a circuit board, an optical network and a lens kit. The circuit board has a mounting surface, and the optical network is coupled to the circuit board opposite the mounting surface. The optical network includes an optical waveguide. The circuit board includes at least one via having an axis generally non-parallel to the mounting surface, and the via extends through the mounting surface and into the optical network. The lens kit includes a lens puck, having a pair of generally parallel surfaces disposed on the axis and a specularly reflective element disposed between the pair of generally parallel surfaces. The lens puck in the lens kit are arranged to correspond with the optical waveguides. The lens kit is adapted to be inserted within the via and to reflect light traveling along the axis into the optical network.

In a further aspect, the present disclosure is directed to a method of forming a lens kit. In the method, a first lens puck is formed to include a substantially transparent material having an index of refraction. A groove is formed within the puck. The groove includes a surface adapted to receive a specularly reflective element. The specularly reflective element is disposed, for example deposited, onto the surface of the groove, and the groove is filled with a fill material. A second lens puck is formed from a substantially transparent material having a generally matching index of refraction and is attached to the first lens puck.

In still another aspect, the present disclosure is directed to a method of forming an optical interconnect in an optical structure. The optical structure includes a circuit board having a mounting surface and an optical network having two or more optical waveguides arranged in layers. The method includes ablating a first hole through the circuit board and ablating a second hole into at least two of the optical waveguides. The first hole includes an axis. The method also includes inserting a plurality of lens pucks into the second hole such that the lens pucks correspond with at least some of the ablated optical waveguides. At least one of the lens pucks includes a specularly reflective element, and the specularly reflective element is optically aligned with one of the optical waveguides when the lens pucks are inserted into the second hole. Photonic signals entering the first hole along the axis are reflected into the optical waveguide aligned with the specularly reflected element.

DETAILED DESCRIPTION

This disclosure relates to optical transitions in the layered optical networks. The disclosure, including the figures, describes the optical transitions and layered optical networks with reference to several illustrative examples. For example, the disclosure proceeds with respect to an optical interconnect in a printed circuit board attached to optical waveguides arranged in layers described below. However, it should be noted that the present invention could be implemented in other circuit boards or devices, as well. The present invention is described with respect to the example optical transitions, an example of which is referred to as lens kit, for illustrative purposes only. Other examples are contemplated and are mentioned below or are otherwise imaginable to someone skilled in the art. The scope of the invention is not limited to the few examples, i.e., the described embodiments of the invention. Rather, the scope of the invention is defined by reference to the appended claims. Changes can be made to the examples, including alternative designs not disclosed, and still be within the scope of the claims.

Figure 1:
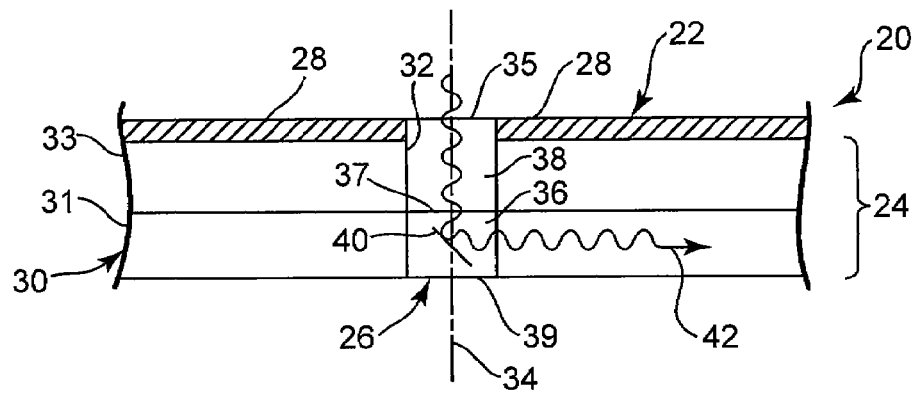
FIG. 1 is a schematic cross-sectioned side view of an optical device constructed in accordance with an example of the present disclosure.

FIG. 1 shows an example optical device 20. The optical device 20 includes a circuit board 22, an optical fiber network 24, and an optical transition such as a lens kit 26. The circuit board 22 includes a mounting surface 28. The optical fiber network 24 is coupled to the circuit board 22 opposite the mounting surface 28. The optical fiber network 24 includes a plurality of optical waveguides 30 arranged in layers. Two optical waveguides 31, 33 are shown in the example. The circuit board 22 includes at least one via 32 having an axis 34 extending generally non-parallel to the mounting surface 28. The axis 34 in the example extends generally perpendicular to the mounting surface 28. The via 32 extends through the mounting surface 28 and into the optical fiber network 24. The lens kit 26 includes a plurality of lens pucks 36, 38.

The lens pucks 36, 38 correspond with at least some of the optical waveguides 30. In the example, each of the lens pucks corresponds with an optical waveguide. Specifically, lens puck 36 corresponds with optical waveguide 31 and lens puck 38 corresponds with optical waveguide 33. At least one of the lens pucks 36, 38 include a specularly reflective element 40, such as lens puck 36 in the example. The lens kit 26 can be inserted within the via 32 and can reflect a photonic signal, such a light, from the mounting surface 28 into the optical fiber network 24. By this, the lens kit 26 is configured to reflect the photonic signal 42 from the axis 34 incident on the specularly reflective element 40 into at least one of the optical waveguides 30 in the optical fiber network 24, and similarly can reflect a photonic signal incident on the specularly reflective element 40 from the optical fiber network 24 into the via and toward the mounting surface 28.

The example optical device 20 of FIG. 1 can include several alternatives. As one alternative, the lens kit can only include one lens puck, such as lens puck 36. In this example of a lens kit with a single lens puck, the lens puck includes a pair of generally parallel surfaces 37, 39 that are disposed on the axis 34. The specularly reflective element 40 is also disposed on the axis and in between the surfaces 37, 39. Still further, lens pucks 36, 38 can be formed as a single lens puck with generally parallel surface 35, 39 disposed on the axis 40. Surfaces 35, 37, 39 are shown as parallel in the example, but need not be parallel.

Figure 2:
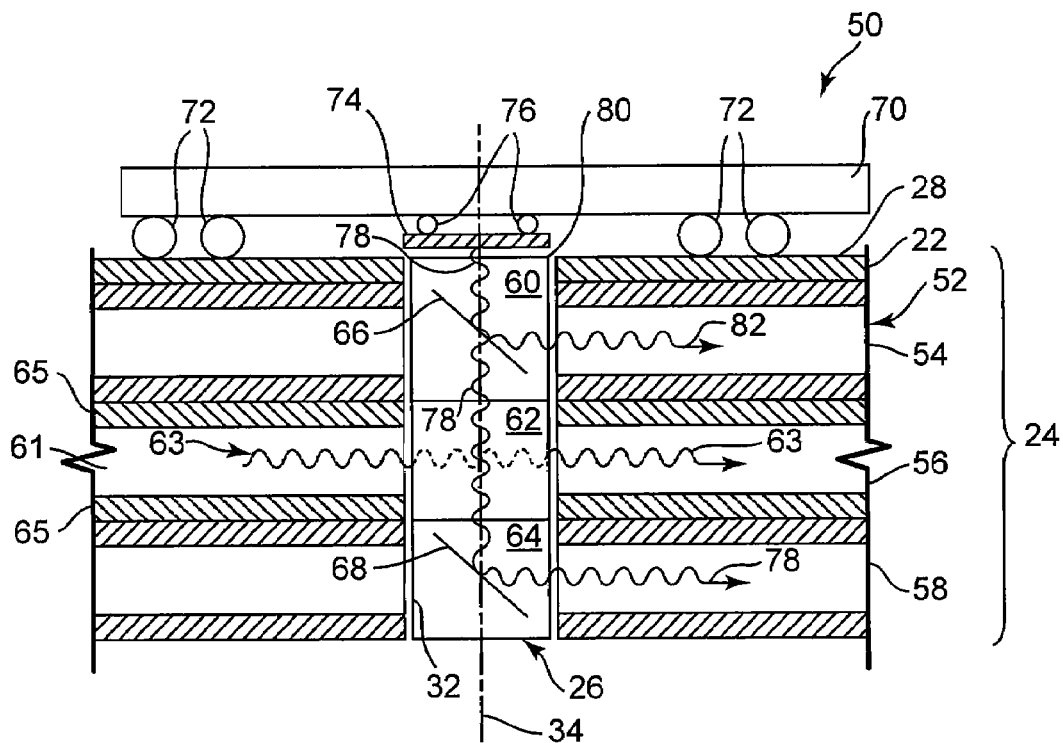
FIG. 2 is a schematic cross-sectioned side view of another example of an optical device.

FIG. 2 shows another example of an optical device 50, where like parts are given like reference numerals. The circuit board 22 is a printed circuit board that includes a generally planar mounting surface 28. The optical fiber network 24 is coupled to the circuit board 22 opposite the mounting surface 28. In the example shown, the optical fiber network includes a plurality of layers 52. Each one of the layers in the example includes an optical waveguide 54, 56, 58 that extend in a plane generally parallel to the mounting surface 28. The via 32 in the example extends along axis 34 through the mounting surface 28 and into the layers 52 of the optical fiber network 24. The axis 34 in the example is generally perpendicular to the mounting surface 28. The lens kit 26 includes three axially stacked lens pucks 60, 62, 64. Some of the lens pucks, specifically lens pucks 60 and 64, include a specularly reflective element 66, 68, respectively. Lens puck 60 corresponds with optical waveguide 54, lens puck 62 corresponds with optical waveguide 56, and lens puck 64 corresponds with optical waveguide 58.

The example is for illustration only, and several variations of the optical device 50 are contemplated. For example, the layers 52 need not be planar to the mounting surface 28. Also, not all of the layers 52 need contain optical waveguides. Further, the via 32 need not extend through all of the layers 52, and lens pucks need not correspond with each of the layers 52. Other variations are contemplated.

The layers 52, which include the optical waveguides 54, 56, 58, extend from the circuit board 22 along the axis 34. Each of the optical waveguides in the example includes generally the same structure as now illustrated in optical waveguide 56. The optical waveguide 56 includes a generally transparent optical core 61, which is adapted to propagate a photonic signal 63. A cladding 65 that guides the photonic signal 63 along the core surrounds the core 61. The cladding 65 generally includes an index of refraction that is less than the index of refraction of the core 61. In the example, the waveguide 56 includes a silica (SiO2) cladding 65 and a Ge-doped silica core 61. Other materials are suitable such as the walls of the core can include a reflective coating that is used to guide the phonic signal along the core 61.

In the example, an integrated circuit 70 is mounted to the printed circuit board 22 as a flip-chip. Conventional integrated circuit mounting pads 72 are used to electrically couple the integrated circuit 70 to the printed circuit board 22. An optoelectronic device 74 is electrically coupled to the integrated circuit 70 with pads 76. The optoelectronic device 74 can include either a photonic generator or a photonic detector. Photonic generators produce optical signals in response to received electrical signals. One example of a suitable photonic generator is a semiconductor laser such as a vertical cavity surface emitting laser, or VCSEL. In contrast, photonic detectors produce electrical signals in response to received optical signals. Examples of suitable photonic detectors include photodiodes such as a positive intrinsic negative diode, commonly referred to in the art as a PIN diode and an avalanche photodiode (APD). Other examples are contemplated, and the optoelectronic device can include a remote generator or detector optically coupled to a waveguide that is terminated directly over the via 32, or the like.

The example of FIG. 2 proceeds with a photonic generator as the optoelectronic device 74 for illustration. The example shows the photonic generator 74 positioned directly over the via 32. The photonic generator produces a photonic signal 78 directed into the via 32 and along the axis 34.

The photonic signal 78 enters the lens kit 26 at a base and is reflected out of the side of the lens kit 26 at selected lens pucks. The photonic signal 78 in the example enters the lens kit 26 at optical port 80 and into the first lens puck 60. The specularly reflective element 66 of lens puck 60 in the example is a partially reflective and translucent element. The photonic signal 78 is partially reflected off of reflective element 66 and into the core of optical waveguide 54 as photonic signal 82. The photonic signal 78 is also partially passed through specularly reflective element 66. The photonic signal 78 then travels along the axis 34 and through lens puck 62 into lens puck 58. The specularly reflective element 68 of lens puck 64 is a totally reflective and opaque element. The photonic signal 78 is reflected off of reflective element 68 and into the core of waveguide 58. In the present configuration, the lens kit 26 operates as an optical splitter. If the directions of the photonic signals 78 and 82 in waveguides 58 and 54 were reversed, however, the lens kit could operate as an optical collector. In this case, the photonic signals would enter the lens kit at the sides into selected lens pucks and would be reflected out of the base, or optical port 80.

Figure 3:
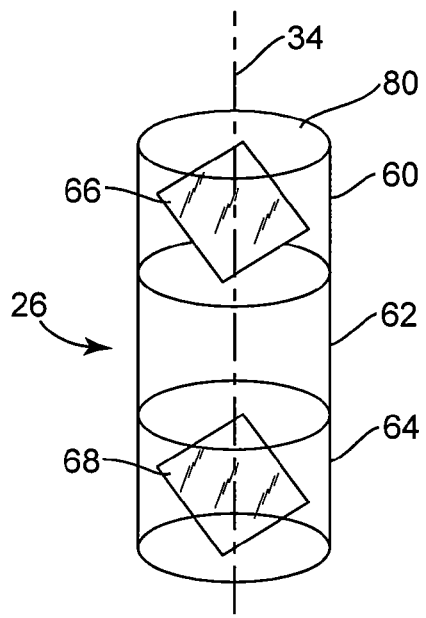
FIG. 3 is a perspective view of a portion of the optical device shown in the example of FIG. 2.

FIG. 3 shows a perspective view of the lens kit 26 of the device 50 illustrating the structure of the lens kit 26 and lens pucks 60, 62, 64. The example shows the lens kit 26 is generally cylindrical, although other configurations including linear or curvilinear edges and planar or curved surfaces are possible. In one embodiment, the cylinder base has a diameter of about 0.015 inches (approximately 0.38 millimeters). FIGS. 2 and 3 show the lens pucks 60, 62, 64 stacked along the axis 34, or axially stacked, together. The lens pucks 60, 62, 64 are shown formed as separate structures bonded together to form the lens kit 26. Alternatively, the lens pucks can be integrally formed together.

The lens pucks 60, 62, 64 include a specularly reflective element within a generally optically transparent material. The material of the lens pucks 60, 62, 64 is chosen to preferably have a high degree of transparency and not to substantially slow or diverge photonic signals in the optical device 50. Also, the lens puck material preferably includes an index of refraction that is generally the same or substantially similar to the index of refraction of the core 61 of a corresponding optical waveguide. The lens kit 26 can be held in place within the via 32 with a generally refractive index matching gel coupling the sides of the lens kit 26 to the optical network 24. In one example, the lens puck material is a thermoset polymer.

The specularly reflective elements 66, 68 in the example of FIG. 3 include reflective metal surfaces within the lens puck material. Preferable metals used to construct the reflective element include gold or nickel plating. The metal plating can be porous to create a partially reflective surface, such as element 66, and allows a percentage of the light to pass through the reflective elements. Various degrees of porosity are possible and are chose depending on the number of additional down-axis partially reflective elements or the amount of loss in the transparent lens puck material. For example, the reflective element 66 in the lens puck 60 proximate the optical port 80 can be created to reflect only twenty percent of the photonic signal 78 into optical waveguide 54 in order to reflect a signal having the same power as that into optical waveguide 58 with distal lens puck 64 because of losses from absorption or misalignment. In the example, a generally planar reflective element is disposed at a forty-five degree angle to the axis 34 to reflect photonic signal 78 orthogonally to the axis 34, although other configurations are possible.

Figure 4:
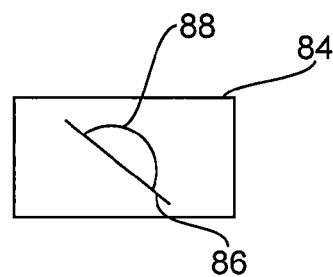
FIG. 4 is a schematic side view of an alternative example of a section of the portion of the optical device shown in FIG. 3.

The lens pucks can be formed in a variety of configurations. FIG. 4 shows a variation 84 of the lens puck 60. Lens puck 84 includes reflective element 86 and a focusing element 88. The lens puck 84 can include one or more focusing elements to help collimate a diverging photonic signal entering into the puck 84 or to help direct the entire reflected signal into the core 61 of the optical waveguide 54. The focusing element 88 can include a transparent lens having a refractive index that is different than the refractive index of the lens puck material and can be selectively shaped to impart the desired optical characteristics. In another variation, the reflective element 66 can be formed from a transparent prism embedded within the lens puck material. Reflection is achieved in the prism through total internal reflection rather than reflection off of a mirrored surface. As a possible alternative, the specularly reflective material could include illuminating nano-particles instead of the metal plating or other materials that direct light into the selected waveguide layers. Still further, the lens puck can be configured to reflect the axial photonic signal in a plurality of non-axial directions. Other variations are contemplated.

Figure 5A:
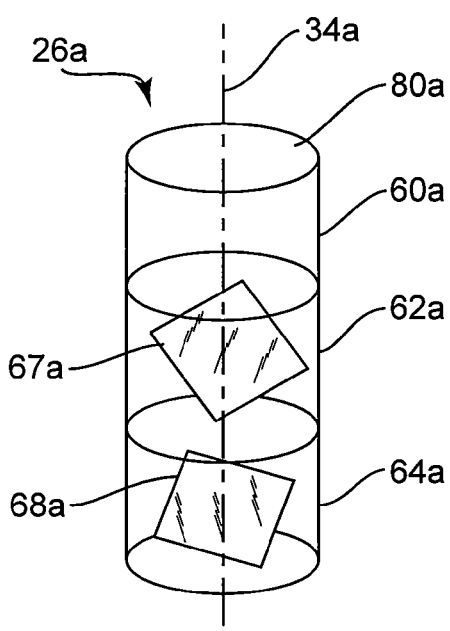
FIGS. 5A and 5B are perspective views of two of many possible alternative examples of the portion of the optical device shown in FIG. 3.
Figure 5B:
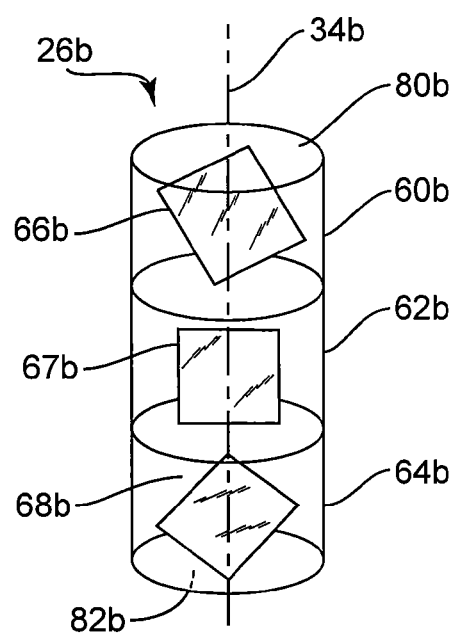

The lens kit 26 also can be formed in a variety of configurations. FIGS. 5A and 5B show two of many possibilities of lens kits 26a and 26b. Lens kit 26a of FIG. 5A includes a transparent lens puck 60a with optical port 80a. Proximate lens puck 62a includes a partially reflective element 67a, and distal lens puck 64a includes a totally reflective element 68a. Reflective element 68a reflects a photonic signal along the axis 34a in a plane generally parallel to the photonic signal reflected with element 67a, but the reflected signals travel in generally perpendicular direction to each other out of the lens kit 26a. Lens kit 26b of FIG. 5B includes a proximate lens puck 60b with optical port 80b and partially reflective element 66b. Intermediate lens puck 62b includes a partially reflective element 67b, and distal lens puck 64b includes a partially reflective element 68b. Light traveling along the axis 34b is partially reflected out of the lens kit 26b in generally parallel planes but in different directions. In addition, the photonic signal exits the lens kit through output port 82b. Many other configurations are possible.

Figure 6A:
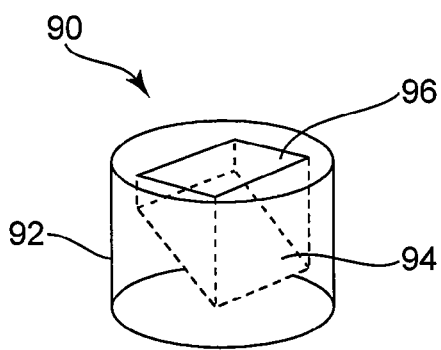
FIGS. 6A, 6B, 6C and 6D are perspective views of the portion of the optical device of FIG. 3 shown in various stages of completion.
Figure 6B:
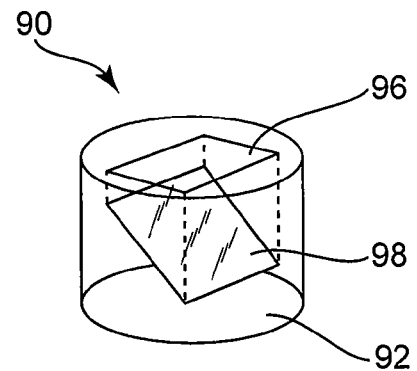
Figure 6C:
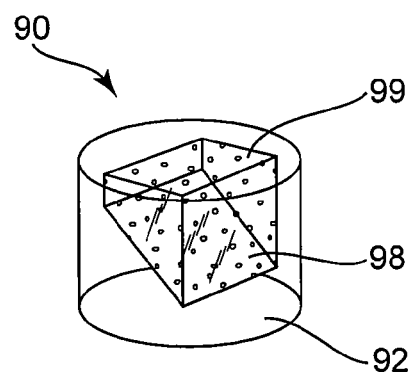

FIGS. 6A, 6B and 6C show a reflective lens puck 90 in various stages of construction. Initially, a lens puck structure 92 is formed of a semi-liquid or partial liquid thermoset polymer or resin material. The structure 92 can be completely shaped, such as cylindrical transparent lens puck, or a lens puck having no reflective element. Alternatively, the structure can be formed just enough to provide a base surface on which to deposit a specularly reflective coating. The material is thermoset or partially cured so as to provide a more rigid structure suitable for further processing. In FIG. 6A, the base surface 94 is formed by cutting, for example ablating, a groove 96 in the partially cured material and polishing the surface smooth and into a selected shape. As an alternative, the structure could be cut or sliced diagonally all the way through to provide the groove for base surface. In FIG. 6B, a mirror coating is applied to the base surface 94 to form the specularly reflective element 96. The coating can be applied with chemical vapor deposition or other suitable process to provide a coating with a selected porosity. In FIG. 6C, the groove 96 is filled with a fill material 99, which is typically the same material as the structure 92. The lens puck material, including the structure 92 and the fill material 99, is fully cured to create the lens puck 90.

Figure 6D:
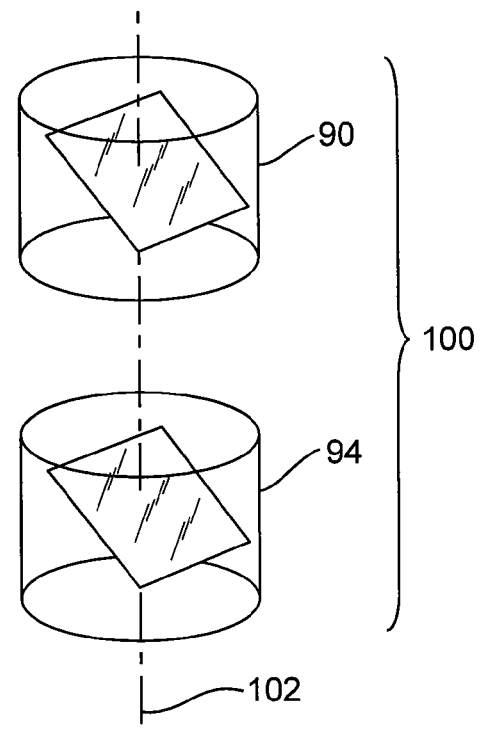

FIG. 6D illustrates that a plurality of individually formed or nearly completely formed lens pucks 90 are assembled together to make a lens kit 100. In this method, a number of lens pucks having translucent reflective elements, opaque reflective elements, multiple reflective elements (for reflecting an axial photonic signal into a plurality of non-axial directions), or transparent lens pucks are fabricated. Lens pucks from this group are the assembled together in a pre-selected configuration and orientation. The lens pucks 90 can be provided to the group as partially cured structures, assembled together along axis 102, and then fully cured to create the lens kit 100. Alternatively, the prefabricated lens pucks 90 can be assembled together with a bonding material, such as the index-matching gel to create the lens kit 100. Alternative methods of fabrication are possible.

The lens kits can be pre-manufactured or manufactured separately from the circuit board and optical network. Previous methods of manufacturing circuit boards with optical networks can included developing vias and optical transitions into the circuit boards as the optical networks were being manufactured. With the present method, the manufacturing process is simplified and improved. Yields of the transitions are improved because the manufacture is not integrated with the manufacture of other components. In addition, the controls and the environment for manufacture of the lens kits is different than the manufacture of the other components. Thus, the separate manufacture of the devices permits an optimized, rather than a compromised, manufacturing environment.

One particular manufacturing example includes a circuit board and optical network that is designed to include a variety of configurations of optical transitions with different types of lens pucks. Sets of similar functioning lens pucks are manufactured together, and then groups of similarly configured lens kits are assembled. Meanwhile, the circuit boards and optical networks are assembled and prepared to receive the lens kits. Lens kits are selected from the pre-assembled groups and appropriately disposed within the vias.

Figure 7A:
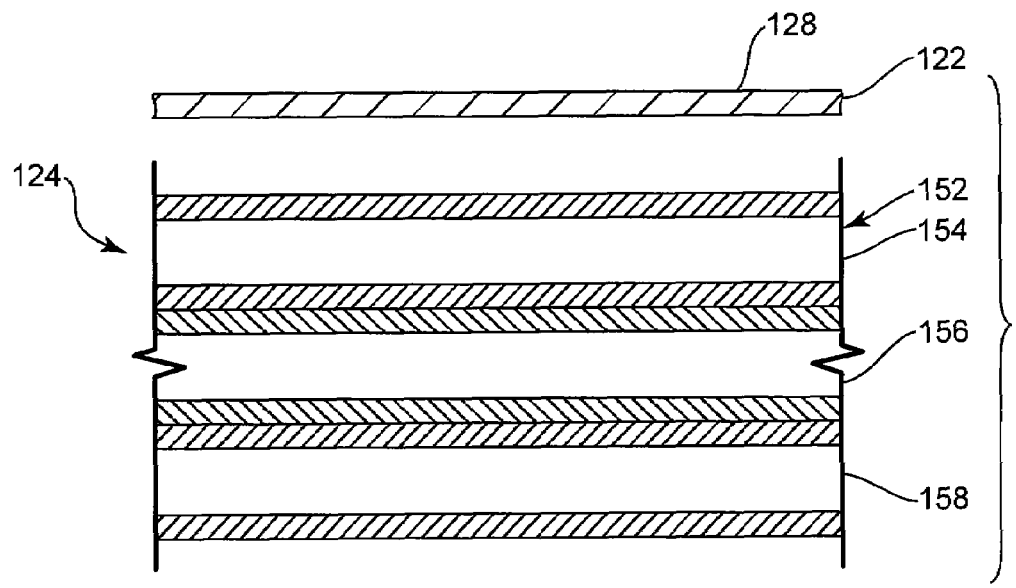
FIGS. 7A and 7B are schematic cross-sectioned views of the optical device of FIG. 2 in various stages of completion.
Figure 7B:
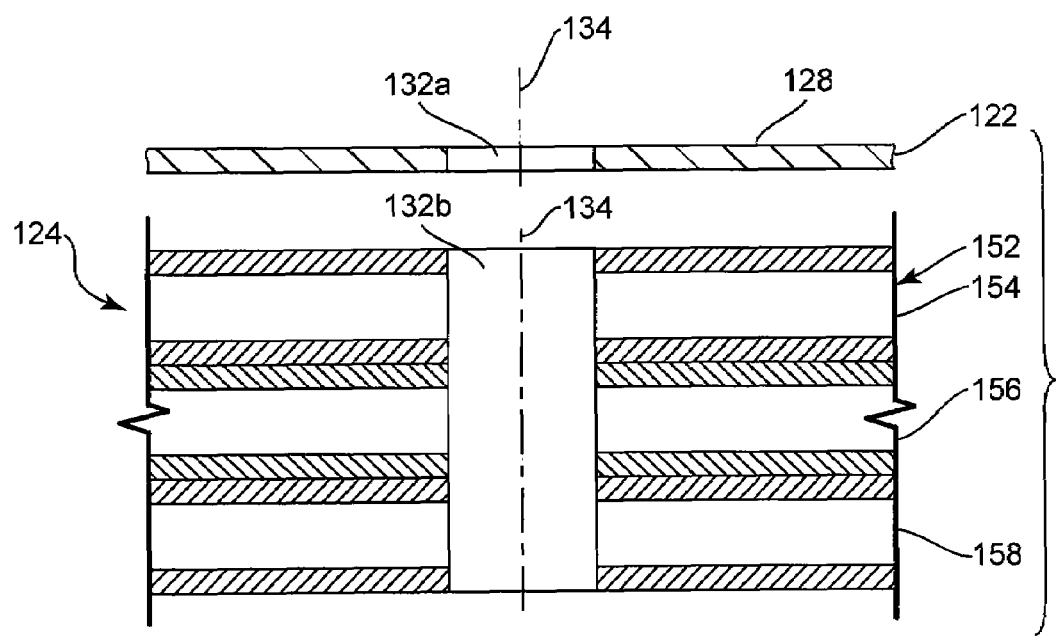

FIGS. 7A and 7B shows the various stages of construction of the optical device 50 described above. FIG. 7A shows a pre-formed typical circuit board 122 having a mounting surface 128 and a pre-formed optical network 124 including at least two optical waveguides 152 arranged in layers. The illustration shows three optical waveguides 154, 156, 158. The circuit board 122 is adapted to be coupled to the optical network 124 prior to, subsequent to, or during the installation of the lens kit 126.

FIG. 7B shows that holes 132a and 132b are ablated in the circuit board 122 and the optical network 124, respectively. The holes 132a and 132b can be ablated before or after the circuit board 122 is coupled to the optical network 124. The holes 132a, 132b can be ablated separately, thus avoiding ablating into dissimilar materials at the same time. Alternatively, the holes 132a, 132b can be ablated after the board 122 is coupled to the optical network 124, thus avoiding having to align the holes in a later manufacturing step. Regardless of when the holes are ablated, the holes 132a, 132b are to be aligned on a common axis 134. The step of ablating can include finishing the hole, such as by polishing the walls of the hole in the optical network 124, to achieve an optically acceptable surface on the waveguides 152. In one example, the holes are cut and finished in the board and optical network separately, and then the board is coupled to the optical network. In another example, the holes are cut in the board and optical network separately, the board is coupled to the optical network, and the hole is finished.

The examples include multiple ways to attach the board 122 with the optical network 124 such that the holes 132a, 132b are aligned together. For example, alignment holes 140 can be created in the board 122 and network 124 that are adapted to accept an alignment tool to hold the board 122 and network 124 together during processing. Another example includes inserting the lens kits 26 into the optical network 124 such that a portion of the lens kit 26 extends from the hole 132b. The extending portion is adapted to fit within the hole 132a in the circuit board 122 to properly align the elements. In this example circuit boards components, such as the optoelectronic device 74, can be attached to board 122 prior to the board being attached to the optical network 124.

During manufacturing, the lens kit 26 is inserted into at least the hole 132b in the optical network such that the lens pucks in the lens kit 26 correspond with the appropriate optical waveguides 154, 156, 158. The lens kit 26 can be held in place with a gel having a matching index of refraction as the lens kit 26 and the waveguide core 61.

One suitable method for inserting several lens kits includes pre-forming the lens kits separately from the manufacture of the board 122 and network 124. Each optical device 50 may require more than one lens kit, and two or more lens kit in the optical device may be of a different configuration. The lens kits of a particular configuration are manufactured together and separated from the lens kits of another configuration. Thus, at least two unique groups of similarly configured lens kits are provided to the manufacturing process in this example. A picker can be used to select the appropriate lens kit from these unique groups to insert the appropriate lens kit into a selected hole 132b in the optical network 124

The present invention has now been described with reference to several embodiments. The foregoing detailed description and examples have been given for clarity of understanding only. Those skilled in the art will recognize that many changes can be made in the described embodiments without departing from the scope and spirit of the invention. Thus, the scope of the present invention should not be limited to the exact details and structures described herein, but rather by the appended claims and equivalents.

What is claimed is:

1. An optical device, comprising:
   a circuit board having a mounting surface adapted to accommodate an electro-optic component such that an active surface of the electro-optic component will be positioned substantially parallel to the mounting surface;
   an optical network including a plurality of optical waveguides arranged in layers, the optical network coupled to the circuit board opposite the mounting surface such that the optical waveguides extend in a plane generally parallel to the mounting surface, wherein the circuit board includes at least one via having an axis generally non-parallel to the mounting surface and positioned at a location adjacent to where the active surface of the electro-optic component is accommodated, the via extending through the mounting surface and into the optical network thus exposing at least one optical waveguide on a side thereof; and
   a lens kit including a plurality of lens pucks adapted to be inserted into the at least one via, wherein at least one lens puck has a specularly reflective element, wherein the lens kit is fixedly attached within the via and arranged to align with the exposed optical waveguides such that the reflective element will reflect light traveling along the axis of the via into the optical network and vise versa.

2. The optical device of claim 1 wherein the optical waveguides each include a portion that extends generally parallel to the mounting surface.

3. The optical device of claim 2 wherein the via extends through at least a plurality of the layers of the optical waveguides.

4. The optical device of claim 1 wherein the plurality of lens pucks are axially stacked.

5. The optical device of claim 1 wherein the lens kit includes a proximate lens puck having a partially translucent specularly reflective element and a distal lens puck having a substantially opaque specularly reflective element.

6. The device of claim 5 wherein the partially translucent specularly reflective element includes a mirrored surface having a selected porosity.

7. The optical device of claim 1 wherein the lens kit includes a substantially transparent lens puck without a specularly reflective element.

8. The optical device of claim 1 wherein the lens puck further includes a focusing element operably coupled to the specularly reflective element.

9. The optical device of claim 1 wherein the lens kit includes a refractive index, and the lens kit is coupled to the optical network with a refractive-index matching gel.

10. The optical device of claim 1 wherein the board includes an optoelectronic device mounted to the board and operably coupled to the lens kit, wherein the optoelectronic device includes at least one of a photonic signal generator and a photonic signal detector.

11. A lens kit adapted for use with a plurality of optical waveguides within an optical network having a via in the optical network exposing portions of the waveguides, the optical waveguides layered in a manner generally perpendicular to the via and extending into the via, the lens kit comprising:
    a plurality of axially disposed lens pucks aligned with at least some of the plurality of layered optical waveguides when positioned within the via, wherein the lens pucks are fixed in one location within the via, and wherein at least one lens puck includes a transparent optical input base and at least one transparent optical output side, and wherein the at least one lens puck includes a specularly reflective element within the lens puck for routing light between the input base and the output side; and
    wherein the specularly reflective element within the at least one lens puck is adapted to reflect a photonic signal traveling along the axis in an off-axis direction and into a corresponding optical waveguide.

12. The lens kit of claim 11 wherein the plurality of axially disposed lens pucks include a transparent lens puck without a specularly reflective element.

13. The lens kit of claim 11 wherein the plurality of axially disposed lens pucks includes a second lens puck having a specularly reflective element including a partially reflective and translucent surface.

14. The lens kit of claim 13 wherein the reflective element in the at least one lens puck is opaque.

15. The lens kit of claim 11 wherein the plurality of lens pucks are integrally formed.

16. The lens kit of claim 11 wherein the reflective element includes a plated mirrored-surface.

17. The lens kit of claim 16 wherein the plated mirrored surface is porous such that the reflective element is translucent and partially reflecting.

18. The lens kit of claim 16 wherein the reflected element includes one of a gold plated surface and a nickel-plated surface.

19. An optical device, comprising:
    a circuit board having a mounting surface adapted to accommodate an electro-optic component at a predetermined location;
    an optical network including an optical waveguide the optical network coupled to the circuit board opposite the mounting surface and extending in a plane generally parallel to the mounting surface, wherein the circuit board includes at least one via having an axis generally non-parallel to the mounting surface, the via extending through the mounting surface proximate to the location accommodating the electro-optic component and into the optical network; and
    a lens kit inserted into the via including a lens puck, wherein the lens puck includes a pair of generally parallel surfaces disposed perpendicular to the axis of the via and a specularly reflective element disposed between the pair of generally parallel surfaces, wherein the lens puck is fixed in one location within the via and aligned with the optical waveguide, and the lens kit is adapted to reflect light traveling along the axis into the waveguide of the optical network.

* * * * *